United States Patent
Kato et al.

(10) Patent No.: US 6,599,603 B1
(45) Date of Patent: Jul. 29, 2003

(54) SILICON WAFER

(75) Inventors: Masahiro Kato, Annaka (JP); Masaro Tamatsuka, Annaka (JP); Osamu Imai, Annaka (JP); Akihiro Kimura, Annaka (JP); Tomosuke Yoshida, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/673,955
(22) PCT Filed: Feb. 25, 2000
(86) PCT No.: PCT/JP00/01125
§ 371 (c)(1),
(2), (4) Date: Oct. 24, 2000
(87) PCT Pub. No.: WO00/52236
PCT Pub. Date: Sep. 8, 2000

(30) Foreign Application Priority Data

Mar. 4, 1999 (JP) ............................................. 11-057738

(51) Int. Cl.$^7$ .............................................. C30B 29/06
(52) U.S. Cl. ...................... 428/64.1; 428/446; 117/931; 117/932; 423/348
(58) Field of Search ............................... 428/64.1, 446; 117/2, 3, 931, 932; 423/348

(56) References Cited

U.S. PATENT DOCUMENTS

| | | | | |
|---|---|---|---|---|
| 5,096,839 A | * | 3/1992 | Amai et al. | 438/16 |
| 5,674,756 A | * | 10/1997 | Satoh et al. | 438/471 |
| 5,935,320 A | * | 8/1999 | Graef et al. | 117/2 |
| 5,968,262 A | * | 10/1999 | Saishouji et al. | 117/13 |
| 6,129,787 A | * | 10/2000 | Adachi et al. | 117/89 |
| 6,157,444 A | * | 12/2000 | Tomita et al. | 356/237.1 |
| 6,204,188 B1 | * | 3/2001 | Abe et al. | 438/706 |

FOREIGN PATENT DOCUMENTS

| | | |
|---|---|---|
| JP | 60-251190 | 12/1985 |
| JP | 404043646 A | * 2/1992 |
| WO | 99/57344 | 11/1999 |

OTHER PUBLICATIONS

"Redissolution of precipitated oxygen in Czochralski–grown silicon wafers", Fumio Shimura, 1981 American Institute of Physics, Appl. Phys. Lett. 39(12) Dec. 15, 1981, pp. 987–989.

"Transmission Electron Microscope Observation of "IR Scattering Defects" in As–Grown Czochralski Si Crystals", Masahiro Kato et al., Jpn. J. Appl. Phys. vol. 35 (1996), Part 1, No. 11, Nov. 1996, pp. 5597–5601.

"Defect Control in Nitrogen Doped Czochralski Silicon Crystals", A. Ikari et al., 1999 Scitec Publications, Switzerland, Solid State Phemomena vols. 69–70 (1999), pp. 161–166 No Month.

* cited by examiner

Primary Examiner—Cathy Lam
Assistant Examiner—Stephen Stein
(74) Attorney, Agent, or Firm—Oliff & Berridge, PLC

(57) ABSTRACT

The present invention provides a CZ silicon wafer, wherein the wafer includes rod-like void defects and/or plate-like void defects inside thereof, and a CZ silicon wafer, wherein the silicon wafer includes void defects inside the wafer, a maximum value of a ratio between long side length L1 and short side length L2 (L1/L2) in an optional rectangle circumscribed the void defect image projected on an optional {110} plane is 2.5 or more, and the silicon wafer including rod-like void defects and/or plate-like void defects inside the wafer, wherein a void defect density of the silicon wafer at a depth of from the wafer surface to at least 0.5 $\mu$m after the heat treatment is ½ or less than that of inside the wafer. According to this, the silicon wafer, which is suitable for expanding reducing effect of void defects by heat treatment up to a deeper region, can be obtained.

12 Claims, 3 Drawing Sheets

SILICON WAFER

TECHNICAL FIELD

The present invention relates to a silicon wafer wherein crystal defects generated inside a silicon single crystal in pulling the crystal by Czochralski method (CZ method) are easily eliminated by heat treatment after pulling the crystal.

BACKGROUND ART

As a wafer for fabrication of a device such as a semiconductor integrated circuit, a silicon single crystal wafer grown by Czochralski method (CZ method) is mainly used. If crystal defects are present in such a silicon single crystal wafer, pattern failure is caused when a semiconductor device is fabricated. Particularly, the pattern width of devices which is highly integrated in recent years is very fine as 0.3 μm or less. Accordingly, even small crystal defects as 0.1 μm may cause defects such as pattern failures in the device, and may remarkably lower a yield and characteristics of the device. Accordingly, a size and density of the crystal defects in the silicon single crystal wafer have to be decreased as thoroughly as possible.

Recently, it has been reported that the crystal defect, what is called Grown-in defects incorporated during growth of the crystal are found in the silicon single crystal grown by CZ method. The main cause of generation of such crystal defects is considered to be a cluster of atomic vacancies which are aggregated during manufacture of single crystal or an oxide precipitate which is an agglomerate of oxygen atoms getting in from a quartz crucible. When these crystal defects are present in the surface portion in which a device is fabricated, they come to harmful defect to degrade characteristics of the device. Accordingly, it is desirable to manufacture a silicon wafer having denuded zone (DZ) of sufficient depth in the surface portion with reduced such crystal defects.

In the above-described grown-in defect, it is known that a shape of grown-in defect as a void type defect has a structure of connecting with a few voids on the basis of octahedron, a size of grown-in defect is about 100–300 nm, and the surface of grown-in defect is covered with oxide film (M. Kato, T. Yoshida, Y. Ikeda, and Y. Kitagawa, Jpn. J. Appl. Phys. 35, 5597, 1996).

FIG. 3 and FIG. 4 show observation diagrams of a void defect projected on a {110} plane by a transmission electron microscope. It is considered that this defect is formed from aggregating atomic vacancies at a temperature range of close to 1150° C. in manufacturing a single crystal by Czochralski method. When such crystal defects are present in the surface portion (at a depth of 0 to 5 μm) of the wafer in which a device is fabricated, they come to harmful defects to degrade characteristics of a device. Accordingly, various methods to reduce such defects have been examined.

For example, it is known that the density of the above-described grown-in void defects can be lowered by high temperature heat treatment to a silicon wafer. However, adopting this method to a conventional silicon wafer grown by CZ method, there is a problem that not a few defects are still present in a inner region of from the wafer surface to about 0.3 μm in depth or more, and a depth of denuded zone becomes shallow. Consequently, a conventional wafer has low flexibility in fabrication of a device.

DISCLOSURE OF THE INVENTION

The present invention has been accomplished to solve the above-mentioned problems, and an object of the present invention is to obtain a silicon wafer, which is suitable for increasing reductional effect of void defects by heat treatment, and expanding denuded zone up to a deeper region.

To solve the above problem, the present invention provides a silicon wafer produced by processing a silicon single crystal ingot pulled by Czochralski method, wherein the silicon wafer includes rod-like void defects and/or plate-like void defects inside the wafer.

As described above, when a silicon single crystal ingot is grown by CZ method, defects inside the ingot are formed in rod-like and/or plate-like shape. As the result of this, a relative ratio of the surface area versus the volume of the defects is higher than that of octahedral defects, and when heat treatment is performed, the defects are reduced up to a deeper region.

In addition, the shape of defects, namely, rod-like and/or plate-like shape in this regard does not mean the shape of void defects such as octahedral or spherical shape included inside a conventional wafer.

For example, in the case of observing the inside of a wafer by a transmission electron microscope, it is regarded as grown-in defect that when an optional rectangle circumscribed a defect image projected on an optional {110} plane is drawn, a maximum value of a ratio between long side length L1 and short side length L2 (L1/L2) is 2.5 or more.

Also, the present invention provides a silicon wafer produced by processing a silicon single crystal ingot grown by Czochralski method, wherein the silicon wafer includes void defects inside the wafer, and a maximum value of a ratio between long side length L1 and short side length L2 (L1/L2) in an optional rectangle circumscribed the void defect image projected on an optional {110} plane is 2.5 or more.

As described above, the wafer whose maximum value of a ratio between long side length L1 and short side length L2 (L1/L2) in an optional rectangle circumscribed a void defect image projected on an optional {110} plane is 2.5 or more is that a relative ratio of the surface area versus the volume of defects is higher than that of octahedral defects, and the defects can be reduced up to a deeper region when heat treatment is performed.

On the other hand, although, the upper limit of the maximum value is not determined in particular, it is supposed to be about 20.

In addition, in order to observe a void defect image projected on an optional {110} plane, using a transmission electron microscope can easily specify a projected plane and correctly observe a defect image.

In this case, it is possible that the above-described single crystal ingot is grown by Czochralski method with doping nitrogen.

In order to form void defects in the aforementioned rod-like and/or plate-like shape, for example, when a silicon single crystal ingot is grown by Czochralski method with doping nitrogen, the shape of grown-in defects can be easily changed octahedral shape into rod-like or plate-like shape.

Also, the present invention provides a silicon wafer wherein the silicon wafer is subjected to heat treatment at a temperature of 1000° C. or more for 10 seconds or more.

As described above, when the wafer including rod-like or plate-like defects is subjected to heat treatment, the void defects, which are present nearby the wafer surface, can be eliminated effectively to a deeper region than a conventional wafer including octahedral defects, and such a silicon wafer can be obtained with high quality. Moreover, since defect eliminating effect by heat treatment is very high, higher defect eliminating effect can be obtained by shorter time heat treatment than a conventional wafer.

In this case, a heat treatment temperature is sufficient for 1000° C. or more, and its upper limit is not determined in particular. However, in physically, the upper limit of the heat treatment temperature is sufficient for the melting point of silicon or less, and in considering practical temperature range in a heat treatment apparatus, it is desirable that the upper limit of the heat treatment temperature is about 1350° C. Also, heat treatment time is sufficient for 10 seconds or more, and its upper limit is not determined in particular. However, in considering productivity, it is desirable that the upper limit of the heat treatment time is about 2 hours.

In this case, it is possible that the silicon wafer wherein a void defect density of the silicon wafer at a depth of from the wafer surface to at least 0.5 $\mu$m after the above-described heat treatment is ½ or less than that of the silicon wafer before the heat treatment. Such a silicon wafer, for example, including rod-like void defects and/or plate-like void defects inside the wafer wherein a void defect density of the silicon wafer at a depth of from the wafer surface to at least 0.5 $\mu$m is ½ or less than that of inside the wafer.

Such a silicon wafer has advantage of high flexibility in fabrication of a device, since the wafer has thick denuded zone on the surface. Moreover, since the wafer inside has sufficient density of defects so as to be a gettering site, it is possible that the wafer has ability for gettering as much as it is needed.

As described above, the present invention relates to a silicon wafer produced by processing a silicon single crystal ingot grown by Czochralski method, and since the shape of void defects included inside the silicon wafer is formed in rod-like and/or plate-like shape, the present invention can obtain the wafer whose void defects existed from the wafer surface to a deeper region are eliminated by following heat treatment, and whose denuded zone is thick.

BEST MODE FOR CARRYING OUT THE INVENTION

The present invention will now be described in more detail. However, the invention is not limited thereto.

The present invention have been noticed that a shape of grown-in void defects, which are present in a silicon single crystal grown by CZ method, are changed based on a condition in growth of the crystal, and have been found that when the defects are formed in rod-like or plate-like shape whose relative ratio of the surface area versus the volume of the defects is high, defect reducing effect is expanded by heat treatment up to a deeper region. As the result, the present invention have been completed.

In order to reduce void defects by heat treatment, it is required as the first process that oxygen atoms are dissolved from a surface portion of oxide film existed in an inner wall of void defects, and diffused to a silicon crystal. This is the same phenomena as re-dissolving of oxide precipitates. In the case of re-dissolving of oxide precipitates, it is known that its dissolving speed depends on defect size and especially its shape, and when defects have the same volume, the defect having larger surface area can be easily dissolved (F. Shimura, Appl. Phys. Lett. 39,987,1981).

In the case of void defects as well as re-dissolving of oxide precipitates, comparing with void defects having the same volume, the defect having a larger surface area of a void can be shrunk faster. Namely, when conventional polyhedron type void defects such as octahedral shape are changed into void defects, which have the same volume but larger surface area, formed in rod-like and/or plate-like shape, the defects can be easily eliminated by heat treatment.

As described above, in order to form void defects in rod-like or plate-like shape included inside the wafer, the present inventors found that, for example, when a silicon single crystal is grown by CZ method with doping nitrogen, the silicon wafer having rod-like void defects and/or plate-like void defects can be easily obtained.

The present inventors investigated that when a single crystal was grown by CZ method with doping nitrogen, how a shape of grown-in defects was changed.

Figure 3:
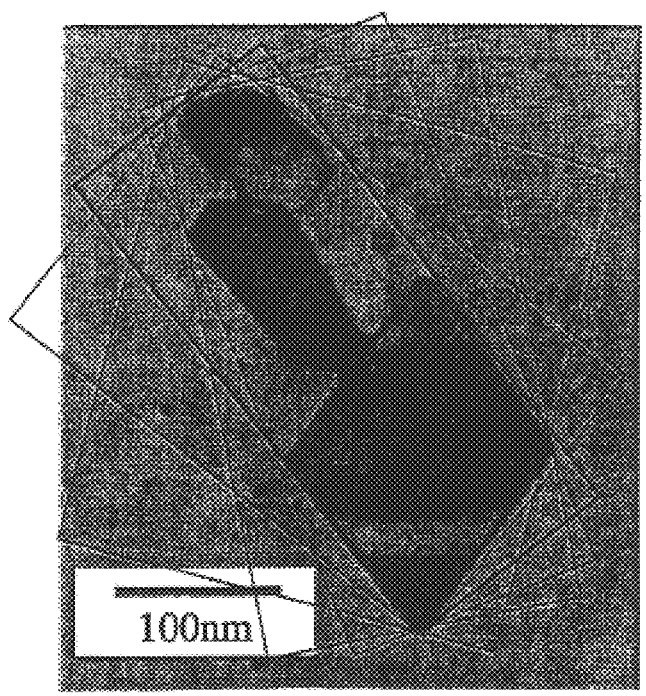
FIG. 3 is a projected view showing a comparatively larger size defect out of measured defects formed in octahedral shape inside a silicon wafer.
Figure 4:
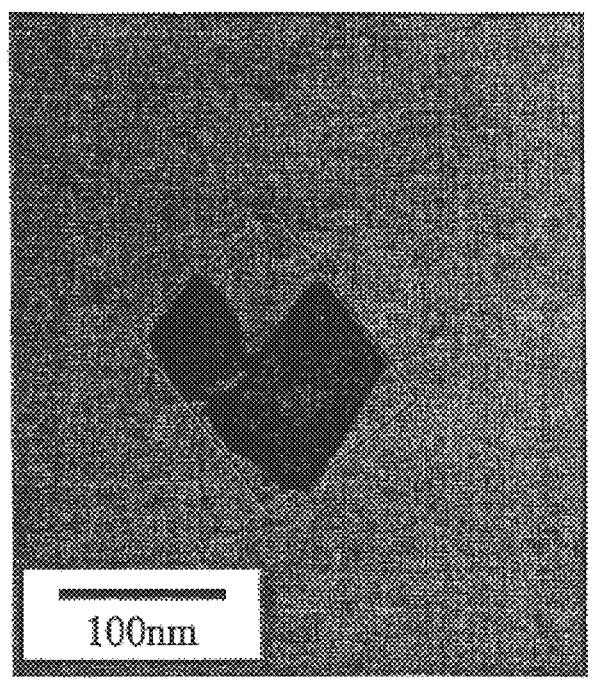
FIG. 4 is a projected view showing a comparatively smaller size defect out of measured defects formed in octahedral shape inside a silicon wafer.

In this point, FIG. 3 and FIG. 4 show shapes of void defects projected on {110} planes by a transmission electron microscope, the defects are included in a wafer sliced from a silicon single crystal ingot grown by CZ method. The size of each defects is different, since passing time of about 1150° C. at which void defects are agglomerated is changed.

As shown in FIG. 3 and FIG. 4, a shape of void defects included in a conventional wafer is formed in octahedral shape, and a maximum value of a ratio between long side length L1 and short side length L2 (L1/L2) in a optional rectangle circumscribed a defect image projected on an optional {110} plane is less than 2.5. Accordingly, a relative ratio of the surface area versus the volume of void defects is small, and subjecting to heat treatment has a little effect to eliminate defects.

Figure 1:
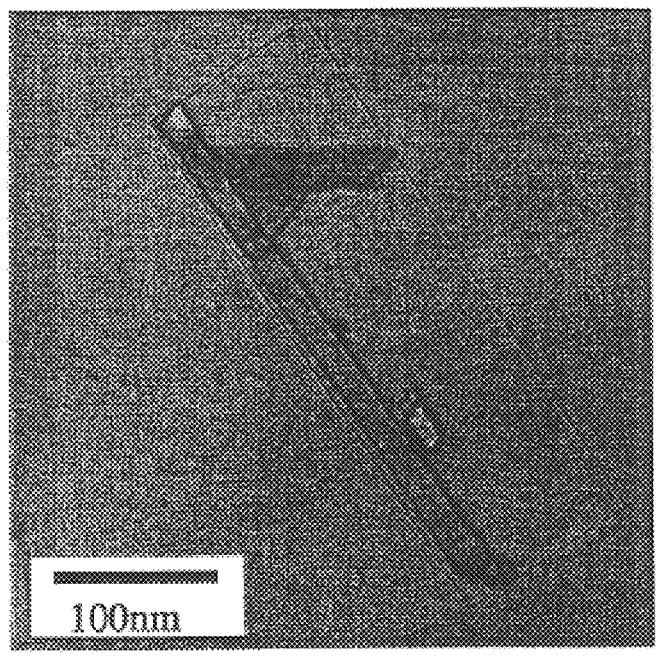
FIG. 1 is a projected view showing a comparatively larger size defect out of measured defects formed in rod-like or plate-like shape inside a silicon wafer.
Figure 2:
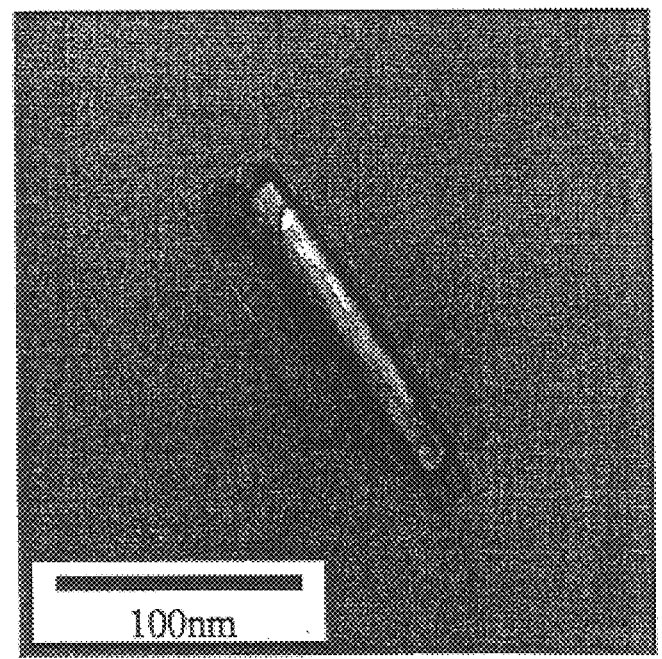
FIG. 2 is a projected view showing a comparatively smaller size defect out of measured defects formed in rod-like or plate-like shape inside a silicon wafer.

On the other hand, FIG. 1 and FIG. 2 show shapes of void defects measured by the same method as FIG. 3 and FIG. 4, the defects are included in a wafer sliced from a silicon single crystal ingot grown by CZ method. By doping nitrogen, a shape of defects formed in conventional octahedral shape is greatly changed. Observing from various viewpoints, it is discovered that the defect of FIG. 1 is combined with three rod-like defects. Also, observing from various angles, it is discovered that the defect of FIG. 2 is a flat-plate type defect having a depth of 200 $\mu$m toward the paper.

Moreover, as shown in FIG. 1 and FIG. 2, the aforementioned maximum values of L1/L2 of void defects in a silicon wafer formed from a silicon single crystal grown by CZ method with doping nitrogen are about 3 in FIG. 1 and about 4 in FIG. 2, and the values of both wafers are larger than that of a conventional wafer. The larger this value means the higher a relative ratio of the surface area versus the volume of the defects. Therefore, extinctive effect of void defects in subjecting to heat treatment is extremely high.

In the present invention, a silicon single crystal ingot in which nitrogen is doped can be grown by CZ method according to the known method such as disclosed in, for example, Japanese Patent Application Laid-open (kokai) No 60-251190.

Namely, in CZ method comprising contacting a seed crystal with a melt of polycrystalline silicon raw material contained in a quartz crucible, pulling it with rotating to grow a silicon single crystal ingot having an intended diameter, nitrogen can be easily doped in a silicon single crystal by placing nitride previously in the quartz crucible, adding nitride into the silicon melt, or by using an atmosphere gas containing nitrogen. Controlling an amount of nitride, concentration or time of introduction of nitrogen gas can control a doping amount in the crystal.

As described above, when a single crystal ingot is grown by CZ method with doping nitrogen, the silicon single crystal ingot having rod-like or plate-like defects can be easily obtained. In this case, the concentration of nitrogen to be doped is preferably controlled between $1.0 \times 10^{10}$–$5.0 \times 10^{15}$ atoms/cm$^3$.

As described above, the silicon single crystal ingot wherein nitrogen is doped in a desirable concentration in CZ method and the crystal includes desirable void defects formed in rod-like or plate-like shape can be thus obtained. After it is sliced with a slicing apparatus such as an inner diameter blade slicer, a wire saw or the like, it is subjected to processes such as chamfering, lapping, etching, polishing or the like to be a silicon single crystal wafer. Of course, such processes are merely examples, and other processes such as cleaning or the like can be conducted, and process can be changed appropriately depending on the purpose, namely, order of processes can be changed, and some processes can be omitted.

Next, when a silicon wafer having crystal defects formed in rod-like and/or plate-like shape is subjected to heat treatment, any apparatuses such as a batch type resistance heating furnace or lamp heating furnace can be adopted as far as a wafer can be subjected to heat treatment at 1000° C. or more for 10 seconds or more.

For example, in order to subject to heat treatment, a rapid heating/rapid cooling apparatus (RTA: Rapid Thermal Annealer) can be also applied. Such an apparatus can effectively subject to heat treatment and improve productivity in manufacturing wafers.

Also, in relation to heat treatment atmosphere, if heat treatment is performed in such as oxygen, hydrogen, argon or mixed atmosphere thereof, oxygen and nitrogen are effectively out-diffused without forming surface film, which is harmful to a silicon wafer, and a void defect density of a wafer surface layer can be easily lowered.

Especially, it is more preferable that if high temperature heat treatment is performed in non-oxidizing or reducing atmosphere such as hydrogen, argon or mixed atmosphere thereof, crystal defects on a wafer surface are easily eliminated. Also, it is confirmed that high temperature heat treatment is performed in mixed atmosphere between hydrogen and argon, slippage is hard to generate in a wafer during heat treatment.

Hereinafter, the present invention will now be described in more detail with the example and comparative example. However, the invention is not limited thereto.

EXAMPLE, COMPARATIVE EXAMPLE

In accordance with CZ method, six single crystal ingots having a diameter of 6 inches, P conductive type and orientation <100> were pulled at a usual pulling rate (1.2 mm/min). Two of them were pulled while silicon wafer having silicon nitride film was previously charged into the silicon melt, so that nitrogen concentration in the crystal was controlled at $5.0 \times 10^{14}$ atom/cm$^3$. At the same time, oxygen concentration in the crystal was controlled at 15 ppma (JEIDA). Since passing time of nearby 1150° C. at which void defects were agglomerated was changed, two kinds of nitrogen doped wafers having different defect size were prepared.

The other four crystal ingots as samples for comparison were pulled in the above-described oxygen concentration without doping nitrogen. In this case, passing time of nearby 1150° C. at which void defects were agglomerated was also changed, and four kinds of wafers without doping nitrogen having different defect size were prepared.

The wafers were sliced with a wire saw from the single crystal ingot thus obtained, and subjected to chamfering, lapping, etching, and mirror polishing. Then, six kind of silicon single crystal mirror polished wafers having a diameter of 6 inches were produced in almost the same condition except whether nitrogen is doped or not, and passing time of nearby 1150° C.

The shapes of void defects inside such obtained silicon wafers were observed by projecting defects on a {110} plane by a transmission electron microscope. As the result of this, it was confirmed that the shapes of almost void defects in two silicon wafers doped with nitrogen were formed in rod-like or plate-like shape as shown in FIG. 1 and FIG. 2, and the above-described maximum values of L1/L2 were 2.5 or more.

On the contrary, it was also confirmed that shapes of void defects in four silicon wafers without doping nitrogen were formed in conventionally-known octahedral shape as shown in FIG. 3 and FIG. 4, and the values of L1/L2 were less than 2.5 at the most.

In order to manufacture examples for a transmission electron microscope, void defects were identified by an infrared scattering tomograph apparatus, and then they were sliced by a focused ion beam apparatus.

Comparison was performed as for a defect density before/after heat treatment in the six resulting wafers, two of which include rod-like void defects and/or plate-like void defects, and four of which include conventional octahedral void defects.

Heat treatment was performed through use of RTA apparatus (rapid heating/rapid cooling apparatus, model SHS-2800 manufactured by Steag Microtec International), and rapid heating/rapid cooling heat treatment is performed at a temperature of 1200° C. for 10 seconds in the atmosphere composed of 75% of argon and 25% of hydrogen.

Density was measured at a depth of from the surface to 0.5 μm by a light scattering method.

Figure 5:
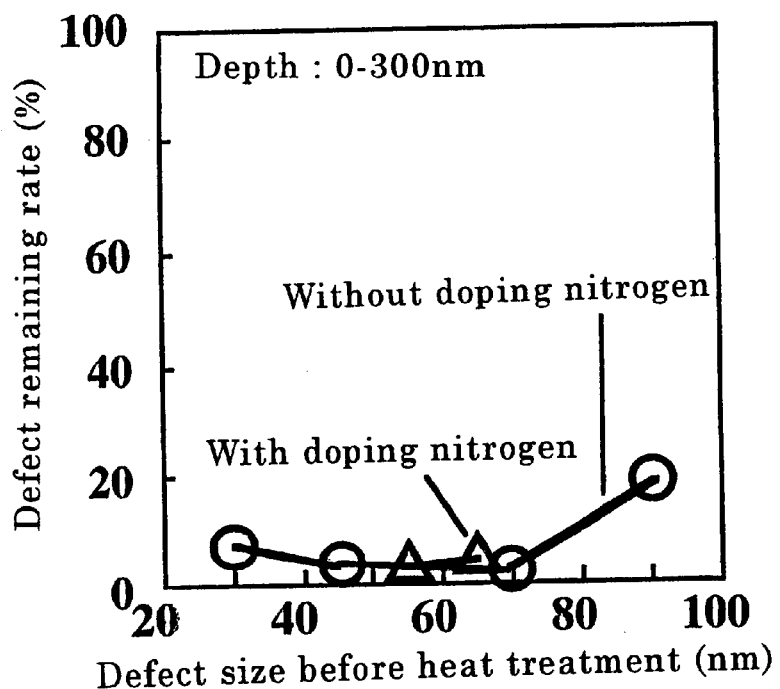
FIG. 5 is a graph showing a defect remaining rate at a region of from the surface to 0.3 $\mu$m in depth after heat treatment.
Figure 6:
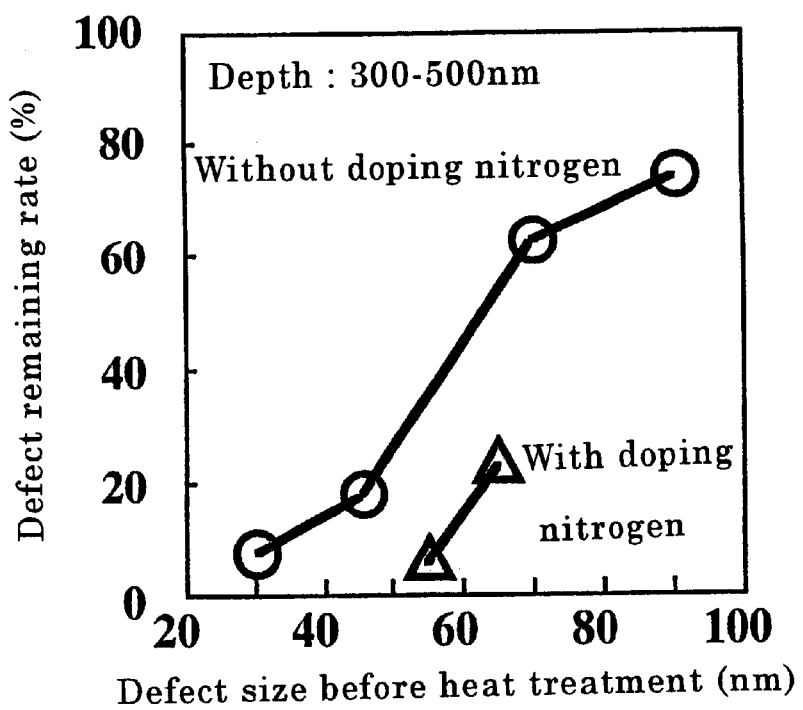
FIG. 6 is a graph showing a defect remaining rate at a region of 0.3–0.5 $\mu$m in depth from the surface after heat treatment.

The results are shown in FIG. 5 and FIG. 6. FIG. 5 shows a defect remaining rate at a shallow region of from the surface to 0.3 μcm. FIG. 6 shows a defect remaining rate at a region of 0.3–0.5 μm in depth from the surface. The horizontal axis of both graphs show an average size of defects in each wafer before heat treatment. The vertical axis of both graphs show a rate of the defect density after heat treatment versus the defect density before heat treatment. Circular plots in the graphs represent the data of silicon wafers having octahedral void defects, and triangular plots represent the data of silicon wafers having rod-like or plate-like void defects.

At a shallow region of from the surface to 0.3 μm in FIG. 5, it is clear that defects are eliminated regardless of the shape of void defects. On the contrary, according to the results at a deep region in FIG. 6, rod-like or plate-like void defects are more easily eliminated than octahedral void defects.

The size of defects measured by a light scattering method was calculated as diameter regarding its defect as spherical body based on the scattering light intensity of the defect. Therefore, the data represented as the same sizes in the graphs of FIG. 5 and FIG. 6 is actually implied as the same volumes. That is, it means that when each void defect have the same volume, the void defects formed in rod-like or plate-like shape are more easily eliminated than the void defects formed in octahedral shape. It is assumed that the void defects formed in rod-like or plate-like shape have larger surface area than the void defects formed in octahedral shape, and consequently the void defects formed in rod-like or plate-like shape are more easily eliminated than the void defects formed in octahedral shape.

Also, as shown in FIG. 6, the void defect density after heat treatment in the silicon wafer of the example is lowered as 30% or less even at a deep region of 0.3–0.5 $\mu$m in depth from the wafer surface. It means that the void defect density in the silicon wafers of the present invention including rod-like or plate-like void defects can reach the density of ½ or less than inside of the wafers at a depth of from the surface to at least 0.5 $\mu$m. That is, the silicon wafers of the present invention have thick denuded zone, have void defects to be a gettering site, inside the wafer, and have high flexibility in fabrication of a device and high yield.

In addition, the present invention is not limited to the above-described embodiment. The above-described embodiment is merely an example, and those having the substantially same structure as the technical ideas described in the appended claims and providing the similar action and effects are included in the scope of the present invention.

For example, in the present invention, including rod-like and/or plate-like defects inside the wafer is not necessarily limited to defects formed in rectangular parallelepiped or flat plate shape as shown in FIG. 1 and FIG. 2. For example, even if defects are formed in cylindrical or irregular uneven plate-like shape, the effects of the present invention can be achieved as far as void defects whose maximum value of L1/L2 is 2.5 or more are included.

Moreover, according to above-described embodiment, it has been mainly explained the method that the crystal is grown by CZ method with doping nitrogen so as to change void defects inside the wafers into the defects formed in rod-like and/or plate-like shape. However, the present invention is not limited thereto, the present invention also includes the cases that dopant except nitrogen is doped or a shape of void defects are changed into rod-like or plate-like shape by controlling pulling condition of a crystal.

Furthermore, the present invention does not matter whether magnetic field is applied to a melt or not when a silicon single crystal ingot is grown by CZ method. Therefore, the present invention includes not only general Czochralski method but also what is called MCZ method that magnetic field is applied to a melt.

What is claimed is:

1. A silicon wafer produced by processing a silicon single crystal ingot grown by a Czochralski method, wherein the silicon wafer includes rod-like void defects and/or plate-like void defects inside the wafer and wherein a void defect density of the silicon wafer at a depth of from the wafer surface to at least 0.5 $\mu$m is ½ or less than that of the wafer inside.

2. A silicon wafer produced by processing a silicon single crystal ingot grown by a Czochralski method, wherein the silicon wafer includes void defects inside the wafer, wherein a maximum value of a ratio between long side length L1 and short side length L2 (L1/L2) of a rectangle projected to circumscribe the void defects in any {110} plane is 2.5 or more and wherein a void defect density of the silicon wafer at a depth of from the wafer surface to at least 0.5 $\mu$m is ½ or less than that of the wafer inside.

3. The silicon wafer according to claim 1, wherein the silicon single crystal ingot grown by a Czochralski method is doped with nitrogen.

4. The silicon wafer according to claim 2, wherein the silicon single crystal ingot grown by a Czochralski method is doped with nitrogen.

5. The silicon wafer according to claim 1, wherein the silicon wafer is subjected to heat treatment at a temperature of 1000° C. or more for 10 seconds or more.

6. The silicon wafer according to claim 2, wherein the silicon wafer is subjected to heat treatment at a temperature of 1000° C. or more for 10 seconds or more.

7. The silicon wafer according to claim 3, wherein the silicon wafer is subjected to heat treatment at a temperature of 1000° C. or more for 10 seconds or more.

8. The silicon wafer according to claim 4, wherein the silicon wafer is subjected to heat treatment at a temperature of 1000° C. or more for 10 seconds or more.

9. The silicon wafer according to claim 5, wherein a void defect density of the silicon wafer at a depth of from the wafer surface to at least 0.5 um after the heat treatment is ½ or less than that of the silicon wafer before the heat treatment.

10. The silicon wafer according to claim 6, wherein a void defect density of the silicon wafer at a depth of from the wafer surface to at least 0.5 um after the heat treatment is ½ or less than that of the silicon wafer before the heat treatment.

11. The silicon wafer according to claim 7, wherein a void defect density of the silicon wafer at a depth of from the wafer surface to at least 0.5 um after the heat treatment is ½ or less than that of the silicon wafer before the heat treatment.

12. The silicon wafer according to claim 8, wherein a void defect density of the silicon wafer at a depth of from the wafer surface to at least 0.5 um after the heat treatment is ½ or less than that of the silicon wafer before the heat treatment.

* * * * *